United States Patent [19]

Takemae

[11] Patent Number: 4,766,573
[45] Date of Patent: Aug. 23, 1988

[54] SEMICONDUCTOR MEMORY DEVICE WITH ERROR CORRECTING CIRCUIT

[75] Inventor: Yoshihiro Takemae, Tokyo, Japan
[73] Assignee: Fujitsu Limited, Kanagawa, Japan
[21] Appl. No.: 26,519
[22] Filed: Mar. 17, 1987
[30] Foreign Application Priority Data Mar. 18, 1986 [JP] Japan .................................. 61-58205

[51] Int. Cl.[4] ......................... G11C 7/00; G11C 29/00; G06F 11/00; G06F 11/10
[52] U.S. Cl. .................................. 365/222; 365/201; 365/200; 371/13; 371/38
[58] Field of Search ................ 365/222, 230, 201, 200; 371/13, 38

[56] References Cited

U.S. PATENT DOCUMENTS

| 3,810,129 | 5/1974 | Behman et al. | 364/222 X |
| 4,106,108 | 8/1978 | Cislaghi et al. | 365/222 X |
| 4,112,513 | 9/1978 | Elsner | 365/222 X |
| 4,506,362 | 3/1985 | Morley | 371/13 |
| 4,542,454 | 9/1985 | Brcich et al. | 365/222 |

Primary Examiner—Stuart N. Hecker
Assistant Examiner—Alfonso Garcia
Attorney, Agent, or Firm—Armstrong, Nikaido, Marmelstein & Kubovcik

[57] ABSTRACT

A semiconductor memory includes a plurality of cell blocks, a refresh control circuit which sequentially refreshes a plurality of the cell blocks, an access control circuit which accesses a plurality of the cell blocks, and an ECC circuit which is provided in a data path between the access control circuit and the plurality of cell blocks, so that the data which is input from and output to the access control circuit is converted to a predetermined bit converted data (so called code) by the ECC circuit and is stored in the plurality of cell blocks. Accordingly, when the access control circuit accesses the plurality of cell blocks, if the access cannot be carried out for specified cell block which is in a refresh state (that is, a correct data (code) cannot be written to or read from the cell block in a refresh state) the data in the access control circuit side can be reproduced as correct data by the ECC circuit. Therefore, viewed from the external, a predetermined access can be carried out without being affected by the refresh state.

4 Claims, 3 Drawing Sheets

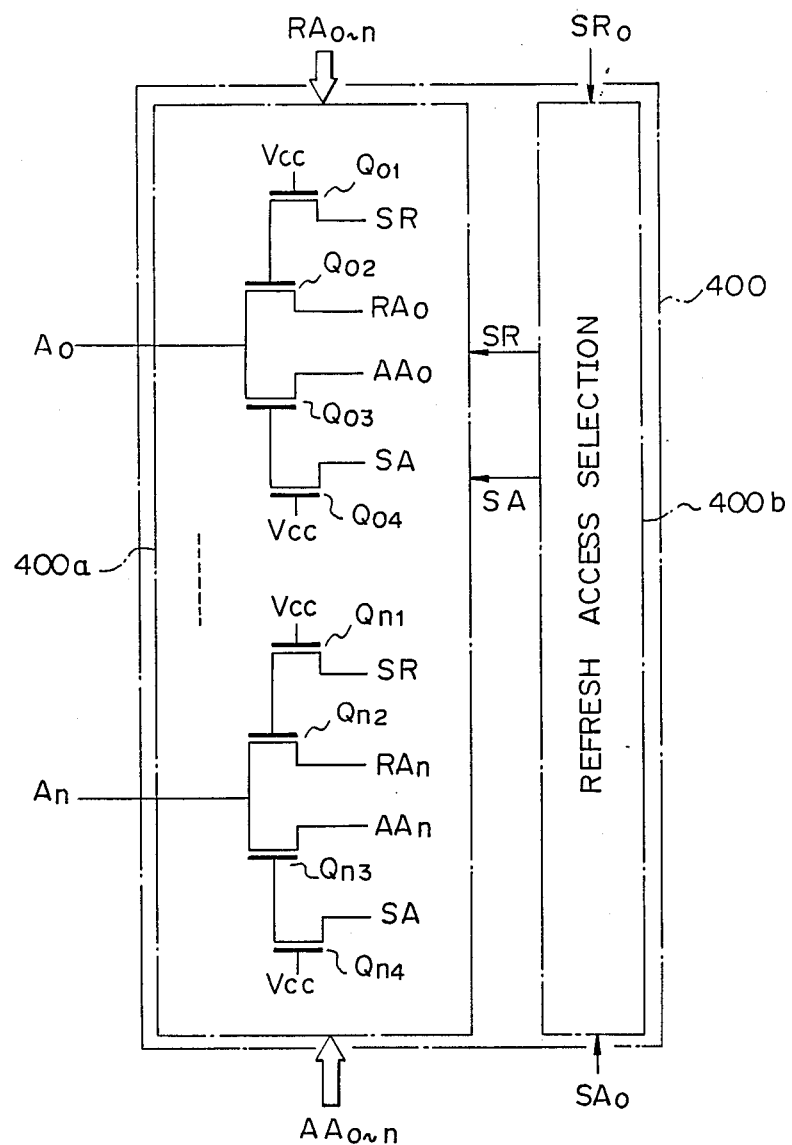

SEMICONDUCTOR MEMORY DEVICE WITH ERROR CORRECTING CIRCUIT

BACKGROUND OF THE INVENTION

1. Field of the Invention

The present invention relates to a semiconductor memory device, in particular, it relates to a dynamic memory which provides an access control circuit and a refresh control circuit.

2. Description of the Related Arts

In this kind of semiconductor memory device in the prior art, eight cell blocks, for example, are provided, and each cell block is provided with a predetermined memory cell array, word decoders, and column decoders, etc. When a block address and row address are output from a refresh control circuit, a predetermined cell block, and a row address in the cell block, are selected sequentially, and a memory cell corresponding to each word line of the plurality of the cell blocks is refreshed sequentially. Then, in accordance with an address signal input from external to an access control circuit, a predetermined memory cell (corresponding to the row address and the column address specified) in a predetermined cell block specified by the address signal is selected, and predetermined data is written from external to the selected memory cell or predetermined data is read from the selected memory cell to external.

A comparator circuit compares the block address output from the refresh control circuit and the block address output from the access control circuit. When the refresh control circuit selects a predetermined cell block, if a selection by the access control circuit of the same cell block is detected by the comparator circuit, the action of the access control circuit is temporarily stopped by the output of the comparator circuit.

On the other hand, when the access control circuit is selecting a predetermined cell, if a selection by the refresh control circuit of the same cell block is detected by the comparator circuit, the action of the refresh control circuit is temporarily stopped by the output of the comparator circuit, and the refresh operation for the cell block is carried over to the next time.

As mentioned above, in the conventional semiconductor memory device, when the specified cell block is in a refresh state, the cell block which is in a refresh state can not be accessed from the external. In such a case, because there is a temporary interruption of the operation of the access control circuit, the operation of the semiconductor memory device and the external circuits connected thereto must be temporarily interrupted, so that a serious problem in which the function is interrupted occurs.

SUMMARY OF THE INVENTION

The present invention is intended to solve such a problem, whereby even if an access can not be carried out for the cell block which is now in a refresh state, the correct data can be written to or read from the cell block via the access control circuit. Then, the dynamic memory can be accessed in a predetermined manner (operated as a so called pseudostatic memory) from the external without being affected by the refresh state.

For solving such a problem the present invention provides a semiconductor memory device comprising a plurality of cell blocks, a refresh control circuit which refreshes a plurality of the cell blocks sequentially, an access control circuit which accesses a plurality of the cell blocks, and an ECC circuit which is provided in a data path between the access control circuit and a plurality of the cell blocks, thereby converting the data which is input from and outputs to the access control circuit to a predetermined-bit converted data by the ECC circuit and stored in a plurality of the cell blocks.

According to the construction as mentioned above, among the converted data stored in the plurality of cell blocks, if the data corresponding to the cell blocks in the refresh state is omitted, the data in the access control circuit side can be reproduced by the ECC circuit as correct data.

In this case, for example, when the semiconductor memory device stores eight bits of data, the eight bit data is converted by the ECC circuit to 12 bits of data (code) and stored in respective cell blocks (that is, 12 of the cell blocks). Then, if one bit among the 12 bits corresponds to the cell block which is in a refresh state, the data (8 bits) in the access control circuit side can be reproduced as the correct data by the ECC circuit.

Further, by converting the 8 bit data to 15 bit data (code) by using the ECC circuit, and the data storing in respective cell blocks (that is, 15 cell blocks), if 2 bits among the 15 bits are omitted, the data (8 bits) in the access control circuit side can be reproduced by the ECC circuit, based on the operation described later.

Further features and advantages of the present invention will be apparent from the ensuing description with reference to the accompanying drawings to which, however, the scope of the invention is in no way limited.

DESCRIPTION OF THE PREFERRED EMBODIMENTS

Figure 1:
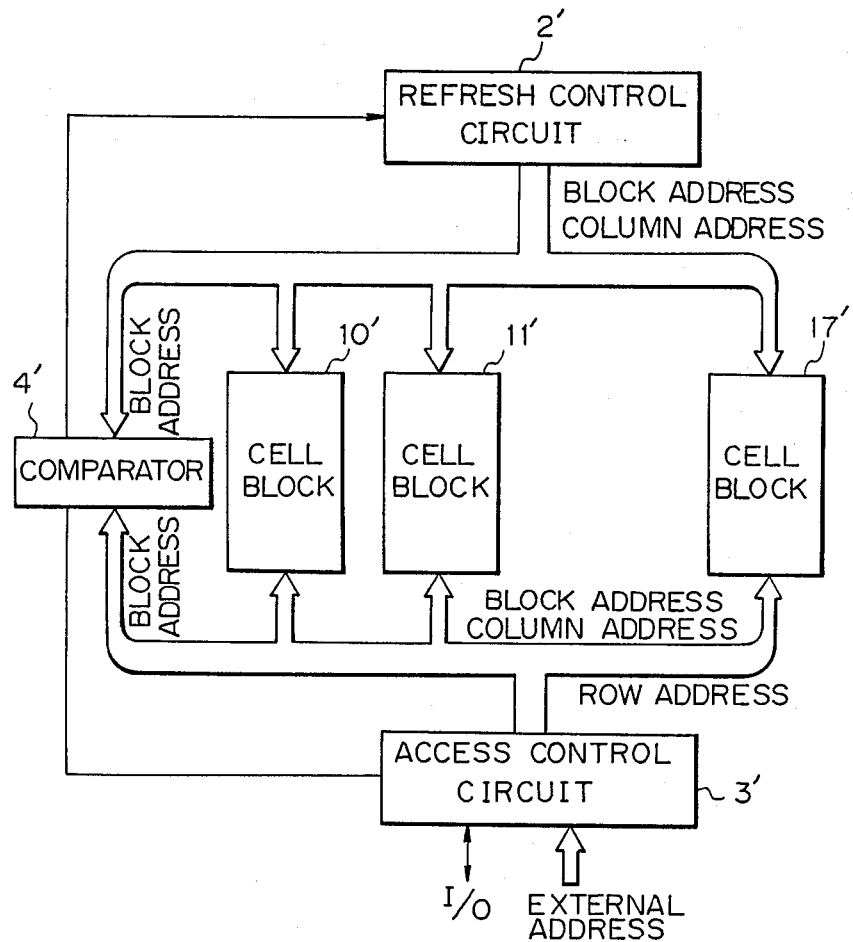
FIG. 1 is a block diagram showing one example of the conventional semiconductor memory device.

FIG. 1 shows an example of this kind of semiconductor memory device in the prior art (substantially the same as disclosed in U.S. patent application Ser. No. 798,785, now allowed, titled "Random Access Memory Device formed on a Semiconductor Substrate having an Array of Memory Cells devided into Sub-arrays", filed Nov. 18, 1985), wherein eight cell blocks 10'-17' are provided and each cell block is provided with a predetermined memory cell array, word decoders, and column decoders, etc. Numeral 2' denotes a refresh control circuit, and when a block address and row address are output from the refresh control circuit 2', a predetermined cell block, and a row address (corresponding to a predetermined word line) in the cell block are selected sequentially, and a memory cell corresponding to each word line of the plurality of cell blocks, is refreshed sequentially. On the other hand, 3' is a usual acccess control circuit, and in accordance with an address signal (formed by a block address, row address, and column address) which is input from the external to the access control circuit 3', a predetermined memory cell (corresponding to the row address and column address specified) in a predetermined cell block (corresponding to the specified block address) specified by the address signal is selected, and predetermined data is written from the external to the selected memory cell or predetermined data is read from the selected memory cell to the external. Further, the refresh control circuit 2' and the access control circuit 3' supply a drive clock for each cell block for driving each circuit unit (for example, decoder, etc.) provided internally.

A comparator circuit 4' compares the block address output from the refresh control circuit 2' and the block address output from the access control circuit 3'. When the refresh control circuit 2' selects a predetermined cell block (for example, 10') (that is, the memory cell in the cell block 10' is in a refresh state), if a selection of the access control circuit 3' of the same cell block (that is, 10') is detected by the comparator circuit 4' (detected by block addresses output from each of the control circuits 2', 3') the action of the access control circuit 3' is temporarily stopped by the output of the comparator circuit 4'.

On the other hand, when the access control circuit 3' is selecting a predetermined cell, if a selection of the refresh control circuit 2' of the same cell block is detected by the comparator circuit 4', the action of the refresh control circuit 2' is temporarily stopped by the output of the comparator circuit 4', and the refresh operation for the cell block is carried over to the next time.

As mentioned above, in the conventional semiconductor memory device as shown in FIG. 1, when the specified cell block is in a refresh state, the cell block in the refresh state can not be accessed from the external (that is, the data in the cell block can not be read or written). In such a case, because of a temporary interruption of the operation of the access control circuit 3', the operation of the semiconductor memory device and the external circuits connected thereto are temporarily interrupted, so that a serious problem wherein the function is interrupted occurs.

The present invention is intended to solve this problem, whereby even if the access action can not be carried out for the cell block which is now in a refresh state, the correct data can be written to or read from the cell block via the access control circuit. Accordingly, the dynamic memory can be accessed in a predetermined memory (operated as so called pseudostatic memory) from the external without being effected by the refresh operation.

Figure 2:
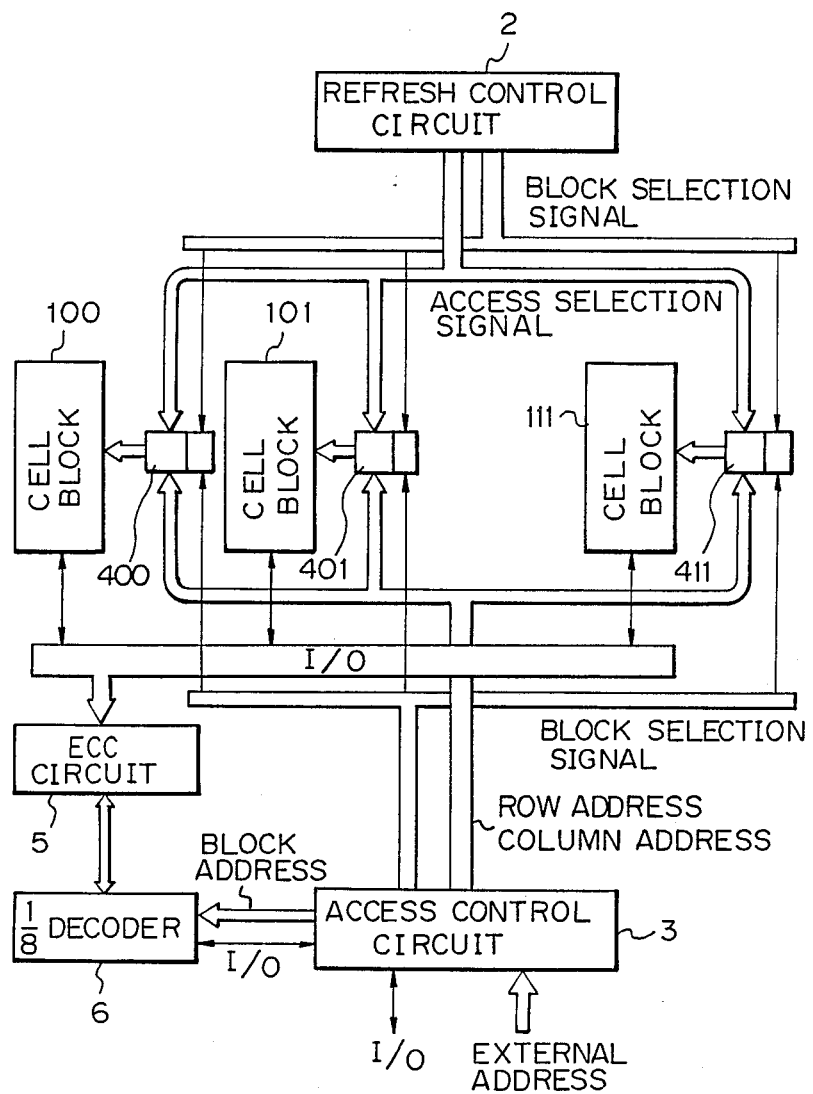
FIG. 2 is a block diagram showing a construction of the semiconductor memory device as one embodiment of the present invention; and, FIG. 3 is a circuit diagram of one embodiment of the selection circuit used in the device shown in FIG. 1.

FIG. 2 shows a construction of the semiconductor memory device as one embodiment of the present invention. In the device shown in FIG. 2, 12 cell blocks 100-111 are provided to store eight bit data input from or output to the external via an access control circuit 3. Predetermined memory cell arrays, word decoders, column decoders, etc., are provided in each cell blocks. Numeral 2 designates a refresh control circuit, and selects a predetermined cell block, and a column address in the cell block, sequentially by outputting the block address and column address signals and the memory cells corresponding to each word line of the plurality of cell blocks are refreshed sequentially. On the other hand, 3 is an access control circuit, and based on the address signal (formed by the column address signal and the row address signal) input from the external to the access control circuit 3, predetermined memory cells (corresponding to the specified column address and the row address) in the plurality of cell blocks 100-111 (in this case, 12) are selected at the same time. Then, as described later, for each selected memory cell, a predetermined data is written in parallel or a predetermined data is read in parallel from the selected memory cell via the ECC circuit 5. In the construction shown in FIG. 2, a drive clock for driving each circuit element (for example, decoder, etc.) provided internally is supplied from the refresh control circuit 2 and the access control circuit 3 to each cell block. Reference 5 denotes an ECC, described in detail later, and 6 designates a ⅛ decoder which holds an eight bit data output from the ECC circuit 5 and inputs or outputs a predetermined one bit data to the access control circuit 3.

Selector circuits 400-411 are provided corresponding to the plurality of the cell blocks 100-111, and these selector circuits 400-411 select a column address received from the refresh control circuit 2 and a column address received from the access control circuit 3 and supplies the selected addresses to the column decoders in corresponding cell blocks. That is, when the refresh control circuit 2 selects a predetermined cell block (for example, 100), (that is, the cell block 100 is in a refresh state), the column address received from the refresh control circuit 2 is supplied to a column decoder in the cell block 100 and the memory cell corresponding to the column address is refreshed. During such a refresh period, the access operation for the cell block 100 from the access control circuit 3 is inhibited. On the other hand, when the access control circuit 3 carries out the access operation for each cell block, the refresh operation for a specified block by the refresh control circuit 2 is inhibited thereafter.

Therefore, when none of the cell blocks is in a refresh state, if the access control circuit 3 reads from a specified memory cell in each of the cell blocks 100-111, 12 bit data is read in parallel and is input to the ECC circuit 5. However, when a specified cell block (for example, 100) is in a refresh state, if the access control circuit 3 reads from a specified memory cell in each of the cell blocks, the access operation for the cell block 100 in the refresh state is inhibited and the read operation from the cell block 100 is not carried out, and 11 bits data read out from the cell block 100 is input to the ECC circuit in parallel.

Here, if the number of a bit of the data (only one bit) among the 12 bit data (code) to be read out from the cell blocks 100–111 is omitted, the ECC circuit 5 corrects the error and reproduces the correct 8 bit data (an ECC circuit having this function is well known). Accordingly, as mentioned above, even if one cell block is in a refresh state, the 11 bits data (code) (one bit is omitted) is converted into the correct 8 bit data and the 8 bit data can be output to the ⅛ decoder 6 side. Subsequently, by sending a predetermined block address signal from the access control circuit 3 to the ⅛ decoder 6 side, one bit data corresponding to the predetermined block address can be selected and read out externally.

On the other hand, when a predetermined write data corresponding to the predetermined block address is input from the external circuit, a predetermined block address signal is sent from the access control circuit 3 to the ⅛ decoder 6 and the write data is output, and the data corresponding to the predetermined block address among 8 bit data held in the ⅛ decoder 6 is rewritten. The 8 bit data thus rewritten is converted into 12 bit data (code) by the ECC circuit 5 and is rewritten to each corresponding cell (corresponding to a predetermined column address and row address) in each of the cell blocks 100–111.

Further, the ECC circuit 5 carries out a reverse conversion of the 8 bit data into 12 bit data, also immediately after the 12 bit data read as mentioned above from of the cell blocks 100–111 (when a cell block is in a refresh state, this is 11 bit data since the data of the cell block in a refresh state is omitted) is converted into 8 bit data, and is operated such that the reverse converted 12 bit data is rewritten to the corresponding memory cell of each of the cell blocks 100–111.

As mentioned above, the 8 bit data input from the external circuit is converted into 12 bit data (code) by the ECC circuit 5 and is written in each corresponding memory cell in the 12 cell blocks. At this time, if a specified cell block (for example, 100) is in a refresh state, the cell block 100 can not be accessed and predetermined data (code) can not be written in the memory cell in the cell block 100, however, the predetermined data can be written into the remaining cell blocks 101–111. Next, when the data is read from the predetermined cell in the plurality of cell blocks 100–111, if another cell block (for example, 101) different from the cell block (that is, 100) which was in a refresh state at the above-mentioned writing time is in a refresh state, the cell block 101 can not be accessed at a read time so that the data can not be read from the cell block 101. At such a time, as mentioned above, at the write time, the predetermined data is also not written in the cell block 100, and then, at a read time, the data (code) from which the read out data from the cell blocks 100 and 101 is omitted (that is, two bits are omitted) is input to the ECC circuit 5.

For processing such a case, in another embodiment of the present invention in place of the ECC circuit 5, a circuit is used in which, if the omitted data is any bits in the range of two bits, the correct data can be reproduced. As mentioned above, if the data communicated via the access control circuit 3 from the external is 8 bits, the ECC circuit 5 is formed so that the 8 bit data is converted into 15 bit data (code), then the number of cell blocks becomes 15. By using such a construction, at the read time, if any two bits (among the 15 data (code) are omitted, a correct 8 bit data can be reproduced.

FIG. 3 shows a schematical diagram of the construction of the selection circuit (for example, 400) shown in FIG. 1. When the cell block 100 is selected in a refresh access selection circuit 400b by the block selection signal (block selection signal SR) input from the refresh control circuit 2, the block selection signal SR is made ON, and thus the transistors $Q_{02}$ to $Q_{n2}$ are made ON via the transistors $Q_{01}$ to $Q_{n1}$ (which are always in the ON state). Then, the row address signals $RA_0$ to $RA_n$ supplied from the refresh control circuit 2 are directly changed to the signals $A_0$ to $A_n$ and are input to the row decoder provided in the cell block 100, so that the memory cell corresponding to the predetermined word line is refreshed. Thus, when the block selection signal SR becomes high level, a high level access operation block selection signal SA supplied via the refresh access selection circuit 400b from the access control circuit 3 to each cell block selection circuit is inhibited from entering the transistors $Q_{04}$ to $Q_{n4}$ in the selection circuit 400.

On the other hand, when the cell block 100 is not in a refresh state, if a high level block selection signal SA is supplied via the refresh access selection circuit 400b from the access control circuit 3 to the bus selecting portion 400a, transistors $Q_{03}$ to $Q_{n3}$ are made ON via the transistors $Q_{04}$ to $Q_{n4}$ which are normally ON, the row address signals $AA_0$ to $AA_n$ are directly changed to the signals $A_0$ to $A_n$ and are input to a row decoder provided in the cell block 100. Further, a column address (not shown in the drawing) supplied from the access control circuit 3 is input to the column decoder provided in the cell block 100, and thus the access operation (read and write of data) to the memory cell corresponding to the predetermined address is carried out.

According to the present invention, even if the cell block which is in a refresh state can not be accessed, correct data can be written or read via the access control circuit. Therefore, although a dynamic memory is used, a predetermined access operation can be directly carried out without affecting the refresh operation, viewed from the external side.

I claim:

1. A semiconductor memory device including a plurality of cell blocks, a refresh control circuit for sequentially refreshing said plurality of said cell blocks and an access control circuit for accessing said plurality of said cell blocks comprising:

an error correcting circuit provided in a data path between said access control circuit and said plurality of said cell blocks, said error correcting circuit converting data received from said access control circuit to data having a larger number of bits than that of said received data and storing the converted data in said plurality of said cell blocks, a plurality of selection circuits each provided respectively in correspondence to said plurality of said cell blocks, said selection circuits selectively supplying column addresses received from said refresh control circuit and column addresses received from said access control circuit to a column decoder in said cell blocks, and when said refresh control circuit selects a predetermined cell block, access from said access control circuit to said predetermined cell blocks is inhibited, and when said access control circuit accesses a predetermined cell block, a refresh by said refresh control circuit to said predetermined cell block is inhibited, when the data is read from a specified cell by said access control circuit while said specified cell is in a refresh state, the data in said specified cell is not read out, and the data from which one bit is omitted is read out in parallel and input to said error correcting circuit, and said error correcting circuit corrects the data from which one bit is omitted into the original number of bits.

2. A semiconductor memory device according to claim 1, wherein when the data is applied to a specified cell block while said specified cell block is in a refresh state, the data is not written into said specified cell, but the data is written into said cell blocks other than said specified cell block.

3. A semiconductor memory device according to claim 1, wherein said error correcting code circuit converts an 8 bit code data into a 12 bit code data, so that if one bit corresponding to the block cell which is in a refresh state is omitted, the correct data can be reproduced.

4. A semiconductor memory device according to claim 1, wherein said error correcting code circuit converts an 8 bit code data into a 15 bit code data, so that if two bits corresponding to the block cells which are in a refresh state are omitted, the correct data can be reproduced.

* * * * *